United States Patent [19]

Goser

[11] 3,865,653

[45] Feb. 11, 1975

[54] LOGIC CIRCUIT HAVING A SWITCHING TRANSISTOR AND A LOAD TRANSISTOR, IN PARTICULAR FOR A SEMICONDUCTOR STORAGE ELEMENT

[76] Inventor: Karl Goser, Lorenzonistrasse 66, 8000 Munich, Germany

[22] Filed: Jan. 2, 1974

[21] Appl. No.: 430,097

Related U.S. Application Data

[62] Division of Ser. No. 295,583, Oct. 6, 1972, abandoned.

[30] Foreign Application Priority Data

Oct. 12, 1971 Germany .......................... 2150794

[52] U.S. Cl. .................. 148/187, 148/175, 148/189

[51] Int. Cl. .................................................. H01l 7/44

[58] Field of Search .................... 148/187, 175, 189

[56] References Cited

UNITED STATES PATENTS

| | | | |
|---|---|---|---|
| 3,614,661 | 10/1971 | Borner et al. | 148/187 X |
| 3,676,921 | 7/1972 | Kooi | 148/187 X |
| 3,698,966 | 10/1972 | Harris | 148/187 |
| 3,728,591 | 4/1973 | Sunshine | 148/187 X |

*Primary Examiner*—L. Dewayne Rutledge
*Assistant Examiner*—J. M. Davis
*Attorney, Agent, or Firm*—Hill, Gross, Simpson, Van Santen, Steadman, Chiara & Simpson

[57] ABSTRACT

A logic circuit having a switching transistor and a load transistor constructed in accordance with complementary channel thin-film techniques wherein the switching transistor is produced by a double-diffusion process and the load transistor of the complementary type is produced during the process steps in the production of the switching transistor.

2 Claims, 4 Drawing Figures

LOGIC CIRCUIT HAVING A SWITCHING TRANSISTOR AND A LOAD TRANSISTOR, IN PARTICULAR FOR A SEMICONDUCTOR STORAGE ELEMENT

This is a division, of application Ser. No. 295,583, filed Oct. 6, 1972 now abandoned.

BACKGROUND OF THE INVENTION

1. Field of the Invention

This invention relates to a logic circuit having a switching transistor and a load transistor in accordance with complementary channel thin-layer techniques.

2. Description of the Prior Art

A method of production for MOS transistors having a very short channel length has been described in the publication *Electronics*, Feb. 15, 1971, Page 99, wherein the process is described as a double diffusion technique. According to the technique described therein, channel lengths in the order of 1 $\mu$ can be produced.

In the double diffusion technique, one is concerned with diffusing a $p$ doping through a window in a mask into a substrate which is, for example, $n-$conductive. Then, after the $p$ doping, a $n+$ doping is produced in a second diffusion step through the same window. Due to a corresponding selection of the parameters in the diffusion steps, it can be obtained that zones are provided in the substrate wherein $n-$, $p$ and $n+$ doping follow each other in a spatial relationship, whereby the $p-$conductive zone can be made very thin. An insulating layer of an oxide on the surface of the substrate may be employed as a mask for the diffusion process.

In accordance with modern circuit techniques, logic circuits are required which have a switching transistor and a load transistor comprising very short switching times. According to the state of the art, field effect transistors are employed for the switching transistor and for the load transistor in such logic circuits. These two transistors are produced in accordance with integrated circuit techniques, in several method steps.

SUMMARY OF THE INVENTION

It is an object of this invention to provide a logic circuit having a switching transistor and a load transistor, which circuit has a particularly short switching time. In particular, the logic circuit is to be constructed at little technical expense in accordance with integrated semiconductor techniques.

The above object is achieved in a logic circuit as described above which, according to the present invention, is particularly characterrized in that the switching transistor is produced by a double diffusion process and the load transistor is produced during the second process step of the double diffusion process employed in producing the switching transistor.

A logic circuit constructed according to this invention has a particularly small power loss, as compared with the corresponding logic circuits produced in accordance with single channel techniques. According to a further development of the invention, logic circuits constructed in accordance with the invention are utilized as bistable flip-flops. A particular advantageous application of such flip-flops is there used as storage elements in semiconductor memories, together with additional selection transistors.

BRIEF DESCRIPTION OF THE DRAWING

Other objects, features and advantages of the invention, its organization, construction and operation will be best understood from the following detailed description of a preferred exemplary embodiment of the invention taken in conjunction with the accompanying drawing, on which.

DESCRIPTION OF THE PREFERRED EMBODIMENTS

Figure 1:
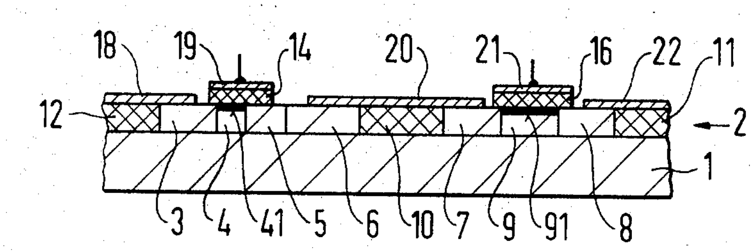
FIG. 1 is a sectional elevational view of a semiconductor logic circuit according to the present invention.

Referring to FIG. 1, a relatively high ohmic resistant substrate is referenced 1. Preferably, the substrate is an insulator, for example a spinel or a supphire. A layer 2 of semiconductive material is carried on the substrate. In the example illustrated in FIG. 1, it is an n-doped material. The semi-conductor material of the layer 2 is $n+-$doped in the area 3 and 6, and $p$-doped in the zone 4. The material of the zone 5 has the unchanged $n$-doped material of the layer 2. The zones 7 and 8 comprise $p$-doping. The zone 9, like the zone 5, has the unchanged semiconductor material of the layer 2; that is, it is $n$-doped material. In the zones 10, 11 and 12, the material of the layer 2 has been oxidized or removed and, in its place, there is a grown insulator material. The zones 14 and 16 are insulation layers, preferably oxide layers, which are effective as gates for the field effect transistors. The reference characters 18, 19, 20, 21 and 22 designate electrically conductive coatings which have the functions of electrodes or contact terminals, respectively.

The zones 3, 4, 5 and 6 belong to the switching transistor of the logic circuit according to the present invention. In the zone 4, an $n$-channel 41 will form at the surface of the semiconductor layer 2, or at the surface of the zone 4, in the range of the transistor, respectively. The zones 5 and 6, together form a zone of the switching transistor. With the example illustrated in FIG. 1, the zone 5 has a lower amount of doping than the zone 6. This provides the advantage that the parasitic capacitance between the zone 5 and the conductive coating 19 can be maintained small. The conductive coatings 18 and 20 form the terminals for the drain and source electrodes, respectively, and the conductive coating 19 is the gate electrode.

The load transistor of the logic circuit according to this invention has the drain and source zones 7 and 9, and a p-channel 91. During operation, the channel 91 is formed below the surface of the layer 2 or of the layer 9, respectively. The electrical terminals 20 and 22 for the drain and source zones 7 and 8 are also associated with the load transistor, as is the gate electrode 21 which is carried on the oxide layer 16.

Figure 2:
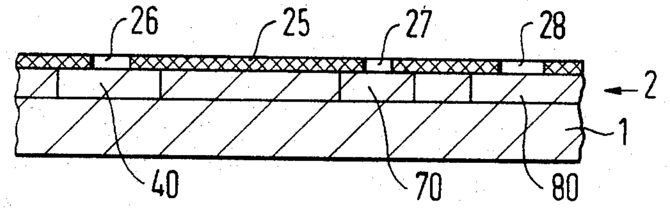
FIG. 2 illustrates, in a manner similar to FIG. 1, the result of the first step in the double diffusion process.

FIG. 2 illustrates the result of a first method step for the production of the logic circuit illustrated in FIG. 1, according to the present invention in integrated circuit technique. As in FIG. 1, the above-described substrate 1 has the semiconductor layer 2 carried thereon. A masking 25 is provided on the surface of the semiconductor layer 2. The mask 25 may, for example, consist of an oxide layer. As illustrated in the drawing, the mask 25 comprises openings at individual locations 26, 27 and 28 through which a diffusion of doping materials can be effected into the material of the semiconductor layer 2. The illustration of FIG. 2 shows the state whereby the diffusion of p-conductive doping material has been effected in the zones 40, 70 and 80. The diffusion has moved under the edges of the openings 26, 27 and 28.

Figure 3:
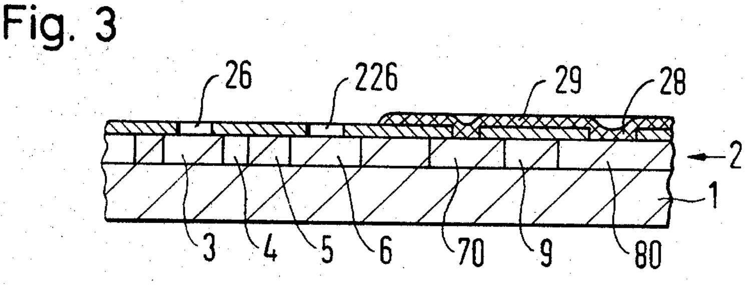
FIG. 3 illustrates the result of the second diffusion step.

FIG. 3 illustrates the substrate 1 with the semiconductor 2 carried thereon after the second diffusion step of the double diffusion process has been performed. Before carrying out this second diffusion step, a further opening 226 is provided in the layer 25 and a covering of the openings 27 and 28 has been effected. This covering has been denoted by the layer referenced 29. The covering can also be effected by means of oxide, whereby nitride layers are provided in order to avoid the growth of oxide at other places which are not to be included beneath the covering, and the nitride layers are subsequently etched away.

In the second diffusion step, an *n*+ doping of the previously p-conductively diffused material of the layer 2 is effected through the openings 26 and 226. In the second diffusion step, diffusion does not advance as far as did the first diffusion so that a zone remains p-conductive, as illustrated in FIG. 1.

After the second diffusion step has been performed, the further prior art method steps are carried out which result in the arrangement of the logic circuit according to this invention as illustrated in FIG. 1. The zones 10, 11 and 12 have been produced by removing the material of the layer 2 and applying the insulator material in these zones. Preferably, growing methods are employed for applying the material on the substrate 1, which methods are well known in the art. Due to the electrical properties of the mask 25, which generally are not sufficiently good for a gate, the mask 25 is removed after reaching the state of construction illustrated in FIG. 3.

A logic circuit according to the present invention can be produced with only two diffusion steps, whereby the load transistor is produced in the first diffusion step of the switching transistor.

According to the invention, there is no drawback for the logic circuit that the load transistor has a longer channel than the switching transistor. The switching time of the switching transistor is essential for the switching times of the logic circuit according to the invention, and the switching time of the load transistor is negligible. This is true, in particular, for the application of the logic circuit as a bistable flip-flop in a semiconductor memory. In such an application, the fact is important that the parasitic capacitance between the gate electrode 19 and the zone 5 of the switching transistor can be maintained very small, due to the selected amount of the doping of the layer 2 in the particular preferred exemplary embodiment of a logic circuit according to the invention, as illustrated in FIG. 1.

Figure 4:
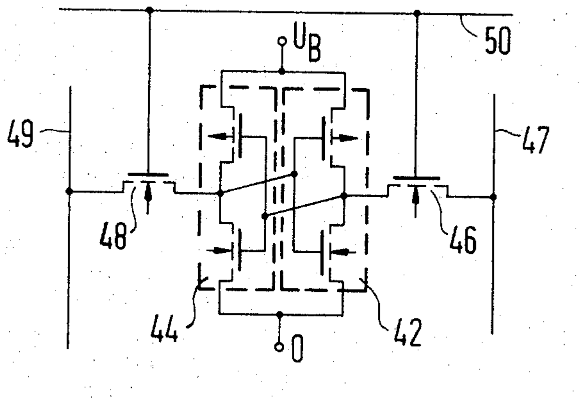
FIG. 4 is a schematic circuit diagram of a logic circuit employed as a storage element, according to the present invention.

FIG. 4 illustrates a circuit diagram of a bistable flip-flop wherein two logic circuits constructed according to the present invention have been interconnected with additional selection transistors. The selection transistors are preferably produced in accordance with the double diffusion technique. This will lead to short switching times. The logic circuits according to this invention have been enclosed in the broken lines 42 and 44. The above-mentioned selection transistors are referenced 46 and 48, and the provision of such transistors is well known in the semiconductor memory art. The memory further includes digit lines 47 and 49 connected to respective ones of the transistors 46 and 48 and a word line 50 connected to both of the transistors 46 and 48. Other features of the circuit employed in a semiconductor memory are readily apparent to one skilled in the art from the representation provided in FIG. 4.

Although I have described my invention by reference to particular exemplary embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for producing a logic circuit including a switching transistor and a load transistor in complementary channel thin layer technique connected to said switching transistor, comprising the steps of: masking a semiconductor layer of a first conductivity type which overlies a high ohmic substrate to expose zones for diffusion, diffusing an opposite conductivity material through said openings into the diffusion zones and under the edges of the openings to produce doped zones of the switching and of the load transistors, masking again by covering some of the openings and providing an additional opening to define a further zone of the switching transistor, diffusing material of the first conductivity type through said opening and contemporaneously limiting advancement of the diffusion in one of the previously diffused zones so that a portion of the previously diffused zone remains, removing the masking, and applying electrical contacts to the diffused zones.

2. The method set forth in claim 1, wherein the second step of masking is further defined as providing a nitride layer over the specified openings to prevent the growth of an oxide coating; and the step of removing the masks is further defined by etching away the nitride layer.

* * * * *